(12) United States Patent
Celo et al.

(10) Patent No.: US 9,806,112 B1
(45) Date of Patent: Oct. 31, 2017

(54) ELECTROSTATIC DISCHARGE GUARD STRUCTURE

(71) Applicants: Dritan Celo, Nepean (CA); Dominic John Goodwill, Ottawa (CA); Eric Bernier, Kanata (CA)

(72) Inventors: Dritan Celo, Nepean (CA); Dominic John Goodwill, Ottawa (CA); Eric Bernier, Kanata (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/269,331

(22) Filed: Sep. 19, 2016

Related U.S. Application Data

(60) Provisional application No. 62/330,569, filed on May 2, 2016.

(51) Int. Cl.
| | | |
|---|---|---|
| *H01L 31/102* | (2006.01) | |
| *H01L 27/144* | (2006.01) | |
| *H01L 31/02* | (2006.01) | |
| *H01L 31/0232* | (2014.01) | |
| *H01L 27/146* | (2006.01) | |
| *H01L 27/02* | (2006.01) | |

(52) U.S. Cl.
CPC .... *H01L 27/1443* (2013.01); *H01L 27/14643* (2013.01); *H01L 27/14647* (2013.01); *H01L 27/14652* (2013.01); *H01L 31/02019* (2013.01); *H01L 31/02325* (2013.01); *H01L 27/0248* (2013.01)

(58) Field of Classification Search
CPC .......... H01L 31/1075; H01L 27/14652; H01L 27/14647; H01L 27/14643
USPC ......................................................... 257/184
See application file for complete search history.

(56) References Cited

U.S. PATENT DOCUMENTS

| | | | |
|---|---|---|---|
| 6,242,763 B1 | 6/2001 | Chen et al. | |
| 6,515,315 B1 * | 2/2003 | Itzler | H01L 31/1075 257/186 |
| 7,683,397 B2 * | 3/2010 | Sarid | H01L 31/1075 257/186 |

(Continued)

FOREIGN PATENT DOCUMENTS

| | | |
|---|---|---|
| CN | 101752396 A | 6/2010 |
| CN | 101969079 A | 2/2011 |
| JP | 4597095 B2 | 12/2010 |

OTHER PUBLICATIONS

Sun et al., "Robust PIN Photodiode With a Guard Ring Protection Structure", IEEE Transactions on Electron Devices, vol. 51, No. 6, Jun. 2004, p. 833-838.

(Continued)

*Primary Examiner* — David Vu
*Assistant Examiner* — Brandon Fox (57) ABSTRACT

The present application provides an electrostatic discharge guard structure for photonic platform based photodiode systems. In particular this application provides a photodiode assembly comprising: a photodiode (such as a Si or SiGe photodiode); a waveguide (such as a silicon waveguide); and a guard structure, wherein the guard structure comprises a diode, extends about all or substantially all of the periphery of the Si or SiGe photodiode and allows propagation of light from the silicon waveguide into the Si or SiGe photodiode.

19 Claims, 8 Drawing Sheets

(56) References Cited

U.S. PATENT DOCUMENTS

| | | | |
|---|---|---|---|
| 8,022,390 B1* | 9/2011 | Kim | H01L 27/1446 250/332 |
| 9,726,841 B1* | 8/2017 | Lin | G02B 6/4275 |
| 2009/0283848 A1 | 11/2009 | Tan et al. | |
| 2010/0301441 A1* | 12/2010 | Pan | H01L 31/022416 257/437 |
| 2014/0021330 A1* | 1/2014 | Russo | G01N 21/6454 250/206 |
| 2014/0048772 A1* | 2/2014 | Kim | H01L 33/06 257/21 |
| 2015/0097257 A1* | 4/2015 | Gambino | G02B 6/122 257/432 |

OTHER PUBLICATIONS

International Search Report dated Jan. 13, 2017 for corresponding International Application No. PCT/CN2016/103595 filed Oct. 27, 2016.

* cited by examiner

Prior art

ELECTROSTATIC DISCHARGE GUARD STRUCTURE

CROSS REFERENCE TO RELATED APPLICATIONS

This application claims the benefit of priority to U.S. Patent Application Ser. No. 62/330,569 entitled "Electrostatic Discharge Guard Structure" filed May 2, 2016, which is hereby incorporated by reference in its entirety.

FIELD OF THE INVENTION

The present application pertains to the field of photonics. More particularly, the present application relates to photodiodes, and methods of manufacture and uses thereof.

INTRODUCTION

Photodiodes (PDs) are semiconductor photodetectors capable of converting light into electric current or voltage. The most commonly used photodetectors are positive-negative (p-n) photodiodes, positive-intrinsic-negative (p-i-n) photodiodes, and avalanche photodiodes.

A photon absorbed at a p-n junction of a p-n PD, or at an intrinsic region, or i-region, of a p-i-n photodiode, generates a pair of current carriers, a hole in the valence band and the electron in the conduction band, which drift towards respective p- and n-doped areas. Incident light generates photocurrent where the voltage output monotonically depends on the amount of incident light. An avalanche photodiode is, in its simplest form, a p-i-n diode with very high reverse bias voltage applied. More advanced avalanche photodiodes include an additional layer called multiplication layer, in which the current carriers multiply through a process called impact ionization.

Due to their simplicity, compactness, and ease of operation, PDs have found a widespread use in consumer electronics devices such as compact disc players, smoke detectors, and the receivers for remote controls in DVD players and televisions. PDs are frequently used for accurate measurement of optical power in science and industry, as well as in various medical applications. In optical communication systems, PDs are used to convert optical signals into electrical signals.

Electrostatic discharge (ESD), from a neighbouring object such as a human body, is a leading cause of failure for electronic integrated circuits (IC) and optoelectronic devices. ESD has been well studied and standardized for ICs and non-silicon-based optoelectronic components. In particular, the ESD sensitivity of non-silicon optoelectronic components such as laser diodes, light-emitting diodes, and InGaAs photodiodes, have been been reported.

In an attempt to protect photodiodes from ESD, electronics manufacturers control air humidity, provide grounded floors and tabletops, and introduce special packaging procedures and materials. These measures are expensive to implement and are not completely effective, with residual ESD damage being sometimes difficult to detect. Furthermore, an ESD can damage the PDs at a customer site, if similar precautionary measures are not implemented.

For optical platform based systems, such as silicon photonics (SiPh) with co-packaged (non-monolithic) drive circuits, previous publications indicate that ESD protection should be included. To date, however, such publications provide no direction as to how to implement ESD protection for SiPhs; further they do not disclose or suggest the design or manufacture of any photonic elements incorporating ESD protection.

Consequently, a need exists for an ESD protection for SiPh systems.

The above information is provided for the purpose of making known information believed by the applicant to be of possible relevance to the present invention. No admission is necessarily intended, nor should be construed, that any of the preceding information constitutes prior art against the present invention.

SUMMARY OF THE INVENTION

An object of the present application is to provide an electrostatic discharge protection for silicon photodiode systems.

In accordance with an aspect of the present application, there is provided a photodiode assembly comprising: a photodiode; a waveguide (such as a silicon waveguide) in communication with the photodiode; and a guard structure, wherein the guard structure extends about substantially all of a periphery of the photodiode and comprises a diode, wherein, when the guard structure is co-planar with the waveguide, the guard structure comprises at least one of:
  a gap; and
  a substantially optically transparent structure at a wavelength of light detectable by the photodiode, and
wherein, when the guard structure is not co-planar with the waveguide, at least one of the following applies:
  the guard structure is disposed in a plane parallel to a plane of the waveguide and is sufficiently spaced apart from the waveguide so that it substantially does not absorb light at the wavelength of light detectable by the photodiode;
  the guard structure comprises a gap; and
  the guard structure comprises a structure that is substantially optically transparent at the wavelength of light detectable by the photodiode.

In some embodiments, the photodiode is a vertical PIN diode. In other embodiments, the photodiode is a PN lateral junction diode.

In some embodiments, the photodiode of the above photodiode assembly is constructed from Si, SiGe, a type III-V material, or any combination thereof.

In some embodiments, the guard structure of the above photodiode assembly comprises a PIN or PN lateral junction diode, P+/Nwell (or N+/P-well) vertical junction, a Zener diode or a combination thereof. The guard structure is optionally a continuous guard ring or a non-continuous guard ring, such as in the case where the guard ring comprises one or two apertures disposed to correspond with entry of the waveguide into the photodiode.

In some embodiments, the guard structure is constructed from Si, Ge, SiGe, a type III-V material, or any combination thereof.

BRIEF DESCRIPTION OF THE FIGURES

For a better understanding of the application as described herein, as well as other aspects and further features thereof, reference is made to the following description which is to be used in conjunction with the accompanying drawings, where:

FIG. 2A is a cross-sectional view of the vertical PIN PD; FIG. 2B is an electrical connections diagram of one embodiment of the PIN PD and guard ring, FIG. 2C is an electrical connections diagram of another embodiment of the PIN PD and a guard ring comprising a combination of protection diodes; FIG. 2D is a top view of the PIN PD which is unidirectional, and FIG. 6E is a top view of the PIN PD which is bi-directional;

FIG. 4A is a cross-sectional view of the vertical PIN PD with lateral guard ring diode; FIG. 4B is an electrical connections diagram of the PD connected in parallel with protection diode, FIG. 4C is a top view of the PIN PD which is unidirectional, and FIG. 4D is a top view of the PIN PD which is bi-directional;

FIG. 5A is a cross-sectional view of the vertical PIN PD; FIG. 5B is an electrical connections diagram of the vertical PIN PD with the SOI gated diode guard structure, FIG. 5C is a top view of the PIN PD which is unidirectional, and FIG. 5D is a top view of the PIN PD which is bi-directional;

FIG. 6A is a cross-sectional view of the vertical PIN PD; FIG. 6B is an electrical connections diagram of the vertical PIN PD with the double-well field effect diode guard structure, FIG. 6C is a top view of the PIN PD which is unidirectional, and FIG. 6D is a top view of the PIN PD which is bi-directional;

FIG. 7A is a cross-sectional view of the vertical PIN PD; FIG. 7B is an electrical connections diagram of the vertical PIN PD, FIG. 7C is a top view of the PIN PD which is unidirectional, and FIG. 7D is a top view of the PIN PD which is bi-directional.

DETAILED DESCRIPTION

Unless defined otherwise, all technical and scientific terms used herein have the same meaning as commonly understood by one of ordinary skill in the art to which this invention belongs.

As used in the specification and claims, the singular forms "a", "an" and "the" include plural references unless the context clearly dictates otherwise.

The term "comprising" as used herein will be understood to mean that the list following is non-exhaustive and may or may not include any other additional suitable items, for example one or more further feature(s), component(s) and/or ingredient(s) as appropriate.

The term "ESD" is used herein to refer to electrostatic discharge.

The term "PD" is used herein to refer to a photodiode or photodetector, which terms are used interchangeably.

The term "GS" is used herein to refer to a guard structure, such as a guard ring or combination of guard elements, used to provide protection from ESD.

The term "SiPh" is used herein to refer to silicon photonics.

The term "SOI" is used herein to refer to silicon on insulator technology.

The term "BOX" is used herein to refer to a buried oxide layer.

Although the Figures and the description provided below depict and describe photodiode structures having p-type regions and n-type regions in particular relative locations, as would be readily appreciated by a worker skilled in the art, each structure will function in an equivalent manner when all of the p type and n type regions are swapped (note that in each structure all of the regions must be swapped, not just a portion). By way of example, with reference to FIG. 6a as shown, the top layer is p+/i/n+/i/p+ and the bottom layer is p++/p+/p++. A suitable alternative is a structure in which the top layer is n+/i/p+/i/n+ and the bottom layer is n++/n+/n++.

Photodiodes (PD) are one of the most ESD sensitive elements of a SiPh die. PDs can suffer from premature breakdown due to locally concentrated electric fields at the junction edges. In order to withstand high ESD voltages, PDs can be designed to incorporate a structure in which the high electric fields are uniformly spread over the junction. PDs can also suffer breakdown due to high electrical fields across the junction. One approach to address this is to design protection diodes in parallel with PDs that allow high current discharge or voltage clamp (i.e., an ESD shunt).

The successful application of a guard structure (GS), such as a guard ring, in silicon photonics PD is limited by the interaction of light with the GS region. SiPh devices operate in a wavelength range wherein the Si is generally transparent and Ge is strongly absorbing. Since Ge is a strong absorber of light in the wavelength range at which SiPhs operate, Ge is suitable as a photodetection material. However, because Ge is a strong absorber of light, it may be disadvantageous to have a region of Ge in a guard structure at the location of light entry into the device, because light absorbed within the guard structure will not create a photodetected current, and consequently the PD responsivity will be reduced. More generally, it is desirable to configure guard structures in such a way that these structures do not interfere with photodetection and propagation of light to the photodetector, while still being operable to mitigate breakdown due to ESD.

When a PD is surrounded on all sides by a guard ring structure, light can be routed to the PD from the top or bottom without encountering the guard ring. However, when light is to be routed to the PD through a waveguide that is parallel to and coplanar with the guard ring, the guard ring presents a barrier between the waveguide and the PD. Furthemore, even when the guard ring is in a separate but parallel plane relative to the waveguide, the proximity of the guard ring can interfere with light propagation through the waveguide where it crosses underneath or overtop of the guard ring. The present invention aims to provide a guard structure that avoids or mitigates these difficulties. This will allow fabrication of a PD, guard structure, and waveguide within a limited planar region, which is desirable for fabrication on a wafer or other structure using lithographic (or layering) techniques.

In a first approach, the guard structure and the waveguide are disposed in parallel but spaced-apart planes. In one embodiment, the spacing is sufficiently large that absorption of light by the guard structure is limited. In an alternative, the guard structure comprises at least one aperture disposed to correspond with the pathway of light propagation from the waveguide to the PD, and to thereby lessen light adsorption by the guard structure. In this approach, the GS can be, for example, above the waveguide, and may be coplanar with the PD. Alternatively, the GS can be below the waveguide, such as under the buried oxide layer.

In a second approach, the guard structure and the waveguide are in the same plane. In most embodiments of this approach, the guard structure comprises at least one aperture disposed so as to allow propagation of light from the waveguide into the PD. In alternative embodiments, the guard structure does not comprise an aperture. In such embodiments, all or a portion of the guard structure is manufactured from semiconducting material that does not absorb light, or only minimally absorbs light, at the wavelength(s) of light detectable by the PD. In the case where only a portion of the guard structure is manufactured from semiconducting material that does not absorb light, or only minimally absorbs light, at the wavelength(s) required by the PD, that portion is disposed to correspond to the entry of the waveguide into the photodiode.

In some embodiments, each of the one or more apertures included in the guard structure comprises an optically non-absorbing semiconducting material that electrically connects the guard structure on either side of the aperture.

In embodiments in which the guard structure comprises an aperture, a bridge structure is optionally included, which electrically connects the guard structure on either side of the aperture. When the guard structure is disposed on a layer of an integrated circuit, the bridge structure may include a first via which connects the guard structure on a first side of the aperture to a second layer of the integrated circuit, a second via which connects the guard structure on a second side of the aperture to the second layer, and a conductive trace formed on the second layer to electrically connect the first and second vias.

In SiPh systems the available optical materials for manufacture of a GS are dielectrics (such as silicon dioxide and silicon nitride), and group IV materials (specifically, Si, Ge, and various compostions of SiGe, including quantum wells composed of Si, Ge and SiGe). Analagous to III-V materials (i.e., the InP/InGaAs/InGaAsP/InGaAlAs/GaAs/GaAlAs materials family), the bandgap can be varied by varying the quantum well geometry and/or the SiGe composition. However, SiGe and quantum wells are more complex to manufacture than Si or Ge themselves, particularly for the large areas and thick layers that are required for integrated photonics. The III-V materials can be crystal latticed matched and complicated multi-composition structures can be grown with few defects. However, Si, Ge and SiGe materials cannot be crystal latticed matched and, thus, it is challenging to grow complicated multi-composition structures with few defects. The minimum number of group IV materials to construct a useful SiPh circuit incorporating PD is two: Si for the waveguide cores and Ge for the PDs.

The present application provides an ESD guard structure (GS) that can be applied to integrated SiPh PD protection. The GS of the present application extends around the periphery of all, or substantially all, of the silicon PD to be protected, and is configured to allow light propagation into the intrinsic region of the PD, where light is converted into the photocurrent. The GS generally forms a ring shape. The PD may lie at least partially in the same plane as the GS, in which case the ring surrounds at least a portion of the PD. Alternatively the PD may lie above or below the plane of the GS, while still being proximate to the GS. In this case, the opening of the ring is aligned with the PD. The light propagates to the PD via a waveguide which lies in a first planar region, which is parallel to (and possibly coplanar with) a second planar region containing the GS. The GS may include an aperture which is aligned with the waveguide, such that the waveguide passes through, underneath or overtop of the aperture. The aperture is used to mitigate interference by the GS with light as it propagates through the waveguide through, underneath or overtop of the aperture.

As would be readily appreciated by a worker skilled in the art, when referring to interference of light transmission by the GS, it is important to ensure that the GS is transparent, or partially transparent, to light at the wavelength(s) detectable by the PD. It is important to ensure that the GS does not absorb, or absorbs minimally, light at the wavelengths of interest (or signal wavelengths), into the PD. This is achieved, as described above, by appropriate selection of material for manufacture of the GS, or by inclusion of one or more apertures in the GS. It is not necessary to consider absorption by the GS of light in non-signal wavelengths.

As used herein in reference to the GS, the term "opening" refers to the interior of a ring shape bounded by the curved internal sidewall of the ring. Thus, the opening corresponds to the interior of the letter "O", for example. The term "aperture" refers to an interruption in the GS ring sidewall that extends from the outer sidewall to the inner sidewall. Thus, an aperture corresponds to the structure which transforms an "O"-shaped ring into a "C"-shaped structure, for example.

In one embodiment, the GS is a guard ring extending around the entire periphery of the silicon PD to be protected. In one example of this embodiment, the guard ring is disposed in a plane that is sufficiently set apart from the waveguide to minimize interference of the GS in light propagation. In an alternative example, all or a portion of the GS is formed from appropriately doped silicon (Si), germanium (Ge) or silicon/germanium (SiGe) such that the guard ring does not absorb input light, or absorbs on a minimal amount of light, and consequently permits light propagation into the intrinsic region of the PD.

A combination of an electrical protection diode (or guard structure) and a photodiode in which the protection diode specifically allows propagation of light from the silicon waveguide may be particularly suitable for use in situations in which the photodiode is Si or Si/Ge.

As would be readily appreciated by a worker skilled in the art, materials other than silicon or germanium can also be used to construct the PD and/or the GS. For example, III-V materials can be used alone, or in combination with silicon and/or germanium.

In one embodiment, the GS is a guard ring that is coplanar with the waveguide and the GS includes an aperture that allows light propagation into the intrinsic region of the PD. The silicon waveguide intersects the ring at the aperture, thus avoiding light absorption by the ring. In one example, the aperture comprises, for example, an undoped silicon region of the ring.

Depending on the PD layout, the GS can have one or two apertures or can be configured from one or two separate doped semiconducting regions. Guard rings with one aperture, resembling a C-shape, can be designed for unidirectional PDs. Rings with two apertures or GS having two separate elements can be designed for bi-directional PDs. In the embodiments in which the GS includes at least two apertures, or is made up of separate semiconducting regions, the GS is considered to be "non-continuous".

In some embodiments, the GS is non-continuous and can include two, three or more electrical protection diodes, arranged around the photodiode, for example to form a ring shape of separate diodes. The electrical protection diodes can be curved into an arcuate shape. The waveguide can be routed through, overtop, or underneath gaps between the diodes. In some embodiments, the GS diodes can be electrically connected using conductive bridges located overtop or underneath the gaps, or using optically transparent semiconducting bridges located within the gaps. Note that in these cases, the GS is electrically continuous, but is still referred to herein as being "non-continuous" because of the non-continuous nature of the diodes within the GS.

In embodiments in which the GS is non-continuous, electrical connections can be introduced between GS sections, for example, through contacts, via and metal (e.g., aluminum or copper) or doped polysilicon sections interconnected with GS sections to create bridge(s). In this embodiment, the integrated SiPh waveguide intersects the GS at the aperture(s). Metallic bridges may be located above or below the optical waveguide region at a distance at which the light in the waveguide does not significantly interact with the metals. This is desirable because metals strongly absorb light. The doped polysilicon can be close to the optical waveguide region such that the light in the waveguide does interact with the doped polysilicon. However, doped polysilicon is a weak absorber of light and, therefore, this doped polysilicon is a mostly transparent region. Generally speaking, the less interactive the bridge material is with the light from the waveguide, the closer the bridge can be placed to the waveguide (assuming a given tolerance for the amount of light that can be absorbed by the GS). In the extreme case the bridge is very (or almost fully) transparent to light in the relevant wavelengths, and can pass through the waveguide.

As discussed above, it is not necessary to include a bridge (e.g., a metal or doped polysilicon bridge) across the light entry region in all embodiments. Rather, the guard structure can contain an aperture without a bridge. When the guard structure includes a single aperture, it is still continuous even without the bridge. When the guard structure includes multiple apertures, each separate section of the guard structure may operate as a separate protection diode, and the GS is non-continuous. However, regardless of the number of apertures present, electrical connectivity provided by bridges typically provides an improved charge distribution throughout the GS, which can enhance the effectiveness of the GS.

In some embodiments, electrical connectivity between multiple portions of the guard structure can be provided using conductive bridge portions (generally metal traces) located overtop or underneath of the semiconducting guard structure, for example on a plane of an photonic integrated circuit comprising conductive traces and connected to the guard structure using vias.

The presently provided GSs can protect PDs of different configurations, including PIN vertical junction and PIN lateral junction PDs.

The GS of the present application can comprise one or more diodes. The particular diode structure can be varied depending on the structure or application of the PD to be protected. As described in more detail below, the GS can be configured as PIN or PN lateral junction diode, P+/Nwell (or N+/P-well) vertical junction, a Zener diode, an SOI gated diode, a double-well field-effect diode, an under-the-box diode or other combinations. These diode types are known to workers skilled in the art, but have not been previously applied to a GS as described herein.

The protection diode will be electrically connected to the PD, so as to protect the PD from the discharge current, thus increasing device robustness to ESD events. The GS provides protection from ESD events by (i) shunting the ESD from the PD; and/or (ii) by shaping the electromagnetic field from the ESD to avoid a strong gradient at the PD during an ESD event or to enhance field uniformity and, thereby, inhibit breakdown from an ESD event. The GS delimits the PD in order to substantially avoid sharp corners and related features associated with undesirable localised enhancement of electric field caused by an ESD event.

The GS can be formed in the silicon layer, and/or formed in the germanium layer. The doping described above may be in the Si or in the Ge (or both).

The silicon waveguide has a silicon core comprising a full thickness of silicon, and a fully-etched region having no silicon. In some embodiments there may be partially etched regions comprising thinner silicon layers. As such, a silicon strip or silicon rib waveguide can be provided. The germanium can be deposited on the top of the silicon core, or on a partially etched region of silicon or on the silicon dioxide of the fully etched region.

The on-chip ESD protection GSs described herein may simplify manufacturing and handling requirements over current alternatives for SiPh PDs. The present GSs allows application of protection in order to enhance SiPh PD robustness to ESD events. The design and fabrication of integrated SiPh PDs with a GS as described herein is compatible with CMOS technology adapted to silicon photonics. Large node size process (e.g., 0.13 um) can be used successfully.

Reference is now made to the drawings to provide greater detail of specific embodiments of the present GS and systems comprising the present GS. It should be noted that the drawings are merely schematic representations not intended to portray specific parameters of the invention. The drawings are intended to depict only typical and exemplary aspects of the invention and are not intended to be limiting.

The drawings and the following description relate to the specific embodiments in which the PD to be protected is a vertical PIN PD. However, as would be readily appreciated, the various GSs described and illustrated below and in the drawings are equally applicable for use in protection of other PDs, such as SiPh PDs, including PIN lateral junction PDs.

Figure 1:
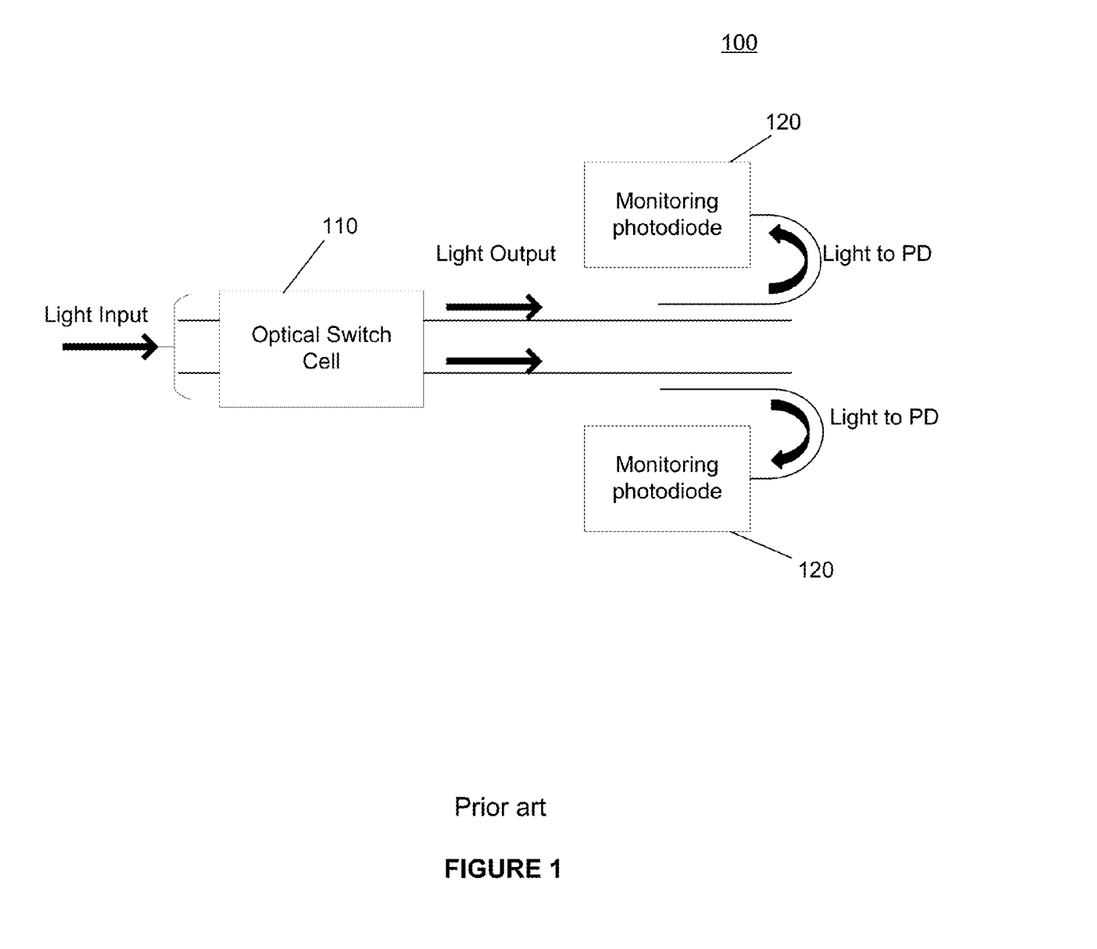
FIG. 1 schematically depicts an integrated silicon photonic switch cell comprising two monitoring photodiodes.

FIG. 1 shows an example of a silicon photonics switch cell 100, comprising optical switch cell 110 and two monitoring photodiodes 120. Input light enters optical switch 110 and is output at the output waveguides. Some portion of the output light is captured at two monitoring photodiodes 120. Incorporation of a GS into the montoring photodiodes 120, as described herein, reduces the susceptibility of the system to ESD events. As noted above, the present GS can be incorporated in PIN PDs, such as, but not limited to, Si PIN PDs, Se/Ge PIN PDs, InGaAs PIN PDs, Ge-on-SOI lateral PIN PDs, Ge-on-SOI with evanescent butt-coupled silicon waveguide to intrinsic Ge. Such PIN PDs can be part of an integrated SiPh switch cell (as shown in FIG. 1), or can be incorporated in other systems where light monitoring is required.

Figure 2:
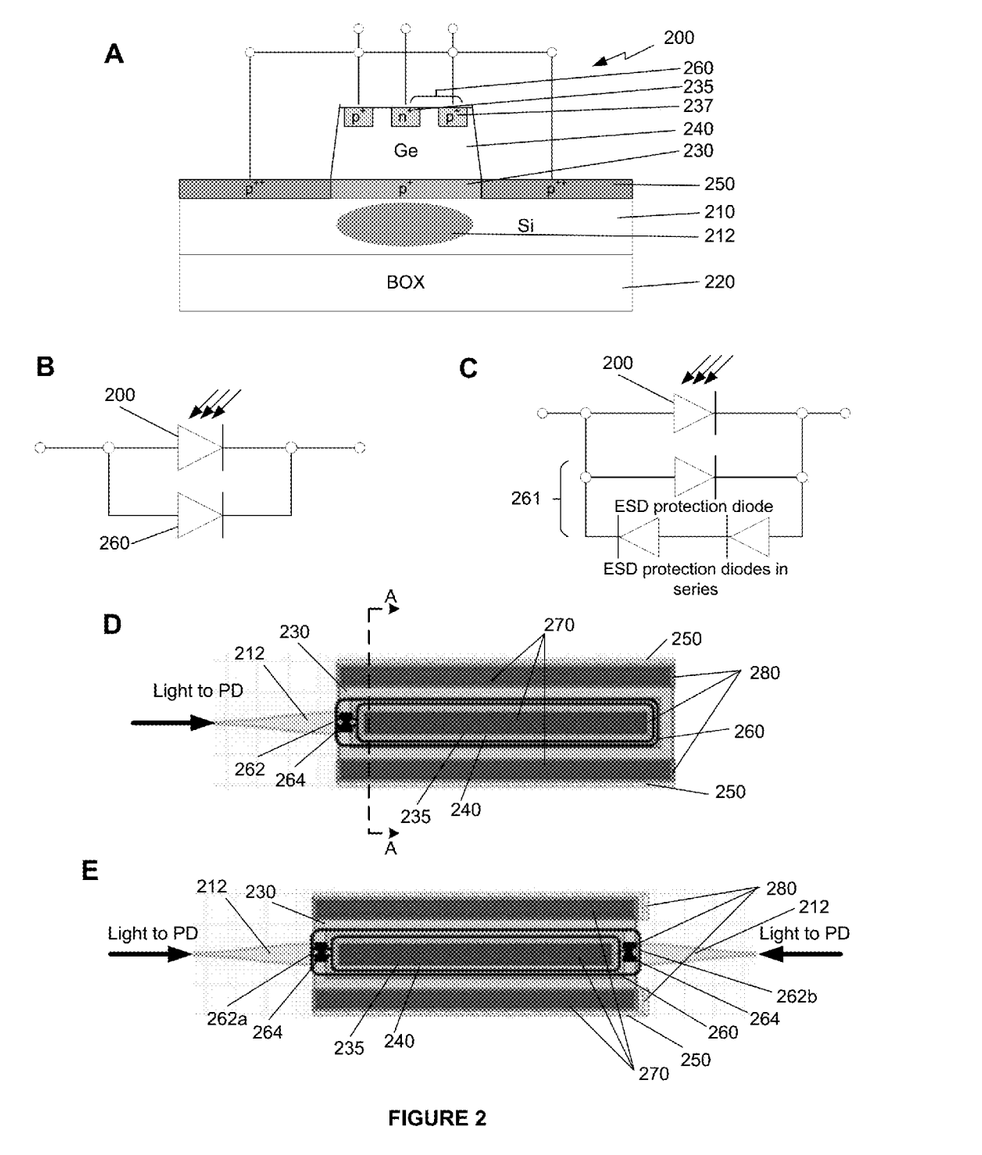
FIG. 2 depicts one embodiment of a vertical PIN photodiode that includes an ESD guard structure that is a lateral PIN diode guard ring with one or two apertures, where

FIG. 2 depicts an embodiment of the GS with a vertical PIN PD. In this example, the GS is a PN lateral junction diode guard ring.

FIG. 2A is a cross-sectional view that depicts Ge-PD 200, which has a vertical PIN configuration, integrated in a SiPh cell, such as an SOI die, comprising silicon layer 210, which comprises the silicon waveguide 212, fabricated above a buried oxide (BOX) layer 220. Vertical PIN PD 200 comprises p+ region 230, n+ region 235 and intrinsic Ge region 240 located between the p+ and n+ regions. Heavily doped silicon p++ regions 250 surrounding vertical PIN PD 200 function to conduct electrical charge within the SiPh cell. Vertical PIN PD 200 is protected by a GS, that is, a guard ring 260. As shown in FIG. 2A, guard ring 260 is a p+/i/n+ lateral junction diode disposed in the Ge layer, in which guard ring 260 shares n+ region 235 with PIN PD 200 and additionally includes p+ region 237. That is, the n+ region 235 forms part of both the PIN PD 200 and the GS. As would be readily appreciated by a worker skilled in the art, an alternative to the structure shown in FIG. 6A is a similar configuration in which there is an additional n+ region that forms part of the guard ring only and a separate n+ region that forms part of the vertical PIN PD only. These two separate n+ regions may be placed side-by-side, for example.

FIG. 2B schematically illustrates a circuit including vertical PIN PD 200 and guard ring 260 (as a protection diode) connected in parallel cathode to cathode. The triple arrows symbolize impinging photons propagated from the silicon waveguide. To ensure optimal operation, the reverse voltage breakdown threshold of the guard ring 260 may be configured to be less than a breakdown voltage of the PIN PD 400, while being higher than a bias voltage of the PIN PD 200.

Other connections may be possible, e.g., cathode to anode, for cases where the PIN PD 200 is used in a "photovoltaic" regime, e.g. as would be found in a solar cell. By way of example, FIG. 2C illustrates an alternative connection layout of vertical PIN PD 200 with guard ring 261 comprising a combination of protection diodes. More particularly, this example makes use of guard ring 261 comprising a combination of protection diodes having the same design as used in guard ring 260 shown in FIG. 2A for protecting vertical PIN PD 200 in both positive and negative ESD voltages. The circuit comprises three parallel branches, a first branch containing photodiode 200, a second branch containing a first ESD protection diode, formed by the guard ring, which is connected cathode to cathode with the photodiode, and a third branch containing two further serially connected ESD protection diodes, formed by the guard ring, which are connected anode to cathode and cathode to anode with the photodiode, respectively. This configuration, in which there are two protection diodes connected in series in one branch of the circuit, provides a threshold voltage of this branch that is higher than the reverse bias operation voltage of the photodiode. This protects the photodiode from high voltages for which the polarity coincides with the reverse bias voltage of the photodiode. The other branch with one protection diode protects the PD from voltages for which the polarity coincides with the forward bias voltage of the PD. This circuit configuration provides ESD protection for both positive and negative voltages.

FIG. 2D is a top view of vertical PIN PD 200, with guard ring 260, and configured for unidirectional light input by inclusion of a single aperture 262, which is aligned with the light path to the PD. In this embodiment, aperture 262 comprises a metallic bridge 264 that electrically connects to the guard ring on either side of aperture 262, however, as would be readily appreciated by a worker skilled in the art, this bridge is optional. The metallic bridge comprises a pair of vias (or posts) which extend away from the guard ring and the light path. A first end of each via is connected to the guard ring, while second ends of the vias, opposite the first ends, are coupled by a conductive material, such as a metallic trace. The conductive material connecting to either side of the aperture is thus located away from the light path.

The presence of the aperture 262 configuration reduces possible interaction of light with the doped ring of guard ring 260. As such, light is able to pass through or alongside guard ring 260 to PD 200 while avoiding absorption in the doped regions of Ge forming the guard ring. In this example, the aperture optionally includes a material that is optically transparent, or substantially optically transparent, to the light having the wavelength(s) of light detectable by the PD. The aperture is disposed so that light having the wavelength(s) of interest for the PD passes from the waveguide to the PD. It should be noted that, since guard ring 260 is not in the same plane as waveguide 212, while it may be beneficial, it is not necessary for guard ring 260 to have an aperture.

Figure 3:
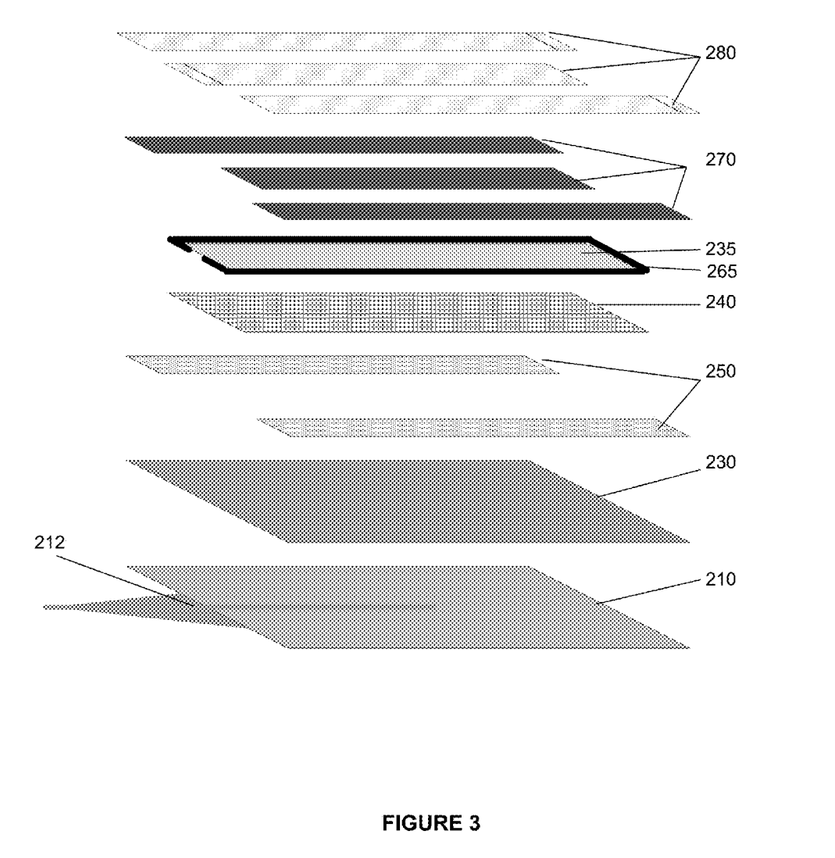
FIG. 3 depicts the layers incorporated in the vertical PIN photodiode as shown in FIG. 2.

The layers of vertical PIN PD 200 are depicted in FIG. 3, and are similar to those of a standard vertical PIN PD including a bottom silicon layer 210, comprising waveguide 212, on which a doped p+ Si region 230 is layered, followed by heavily doped p++ Si regions 250, intrinsic Ge layer 240, doped n+ Ge layer 235 with doped p+ Ge layer 237, metal vias 470 for contact and metal regions 480 for routing. For simplicity metallic bridge 264 is not shown in FIG. 3.

FIG. 2E is a top view of vertical PIN PD 200, with guard ring 260, and configured for bidirectional light input by inclusion of two apertures 262a and 262b. In this embodiment, each aperture 262a and 262b is optionally spanned by a metallic bridge 264. This configuration mitigates interaction of light with the doped ring of guard ring 260 and light is able to pass bidirectionally through or alongside guard ring 260 to PD 200 without being absorbed in the doped Ge. Again, in this example, one or both apertures optionally include a material that is optically transparent, or substantially optically transparent, at a wavelength(s) of light detectable by the PD. The apertures are disposed to extend along the light path through the waveguide so light having the wavelength(s) of interest for the PD passes from the waveguide to the PD. It should be noted that, since guard ring 260 is not in the same plane as waveguide 212, while it may be beneficial, it is not necessary for guard ring 260 to include an aperture.

Figure 4:
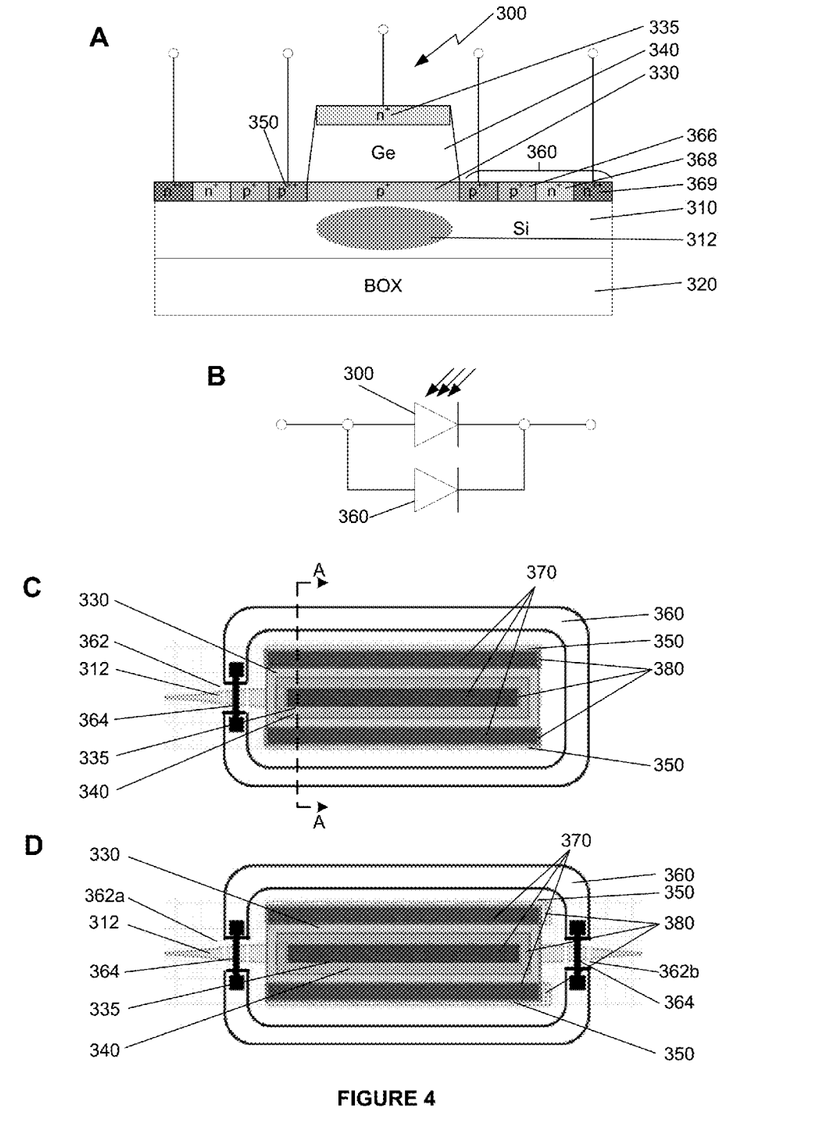
FIG. 4 depicts one embodiment of a vertical PIN photodiode that includes an ESD guard structure that is a lateral PN junction diode guard ring with one or two apertures, where

FIG. 4 depicts another embodiment of the GS. In this example, the GS is a PN lateral junction diode guard ring.

FIG. 4A is a cross-sectional view that depicts vertical PIN PD 300 integrated in a SiPh cell, such as an SOI die, comprising a silicon layer 310, comprising waveguide 312, fabricated on a buried oxide (BOX) layer 320. Vertical PIN PD 300 comprises p+ region 330, n+ region 335 and intrinsic Ge region 340 located between the p+ and n+ regions. Heavily doped silicon p++ regions 350 surrounding vertical PIN PD 300 function to conduct electrical charge within the SiPh cell. Vertical PIN PD 300 is protected by a GS that is guard ring 360. As shown in FIG. 4A, guard ring 360 is a PN lateral junction diode, formed in a layer of silicon, and in a plane that is parallel to the plane of the waveguide. Guard ring 360 comprises p++/p+ doped silicon region 350/366 and n++/n+ doped silicon region 369/368.

FIG. 4B illustrates an electrical schematic representing the vertical PIN PD 300 with guard ring 360 connected in parallel cathode to cathode. The triple arrows symbolize impinging photons propagated from the silicon waveguide.

FIG. 4C is a top view of vertical PIN PD 300, with guard ring 360, and configured for unidirectional light input by inclusion of a single aperture 362. In this embodiment, aperture 362 comprises metal connection 364 (using contact and via), which is optional. The metallic connection, or bridge, comprises a pair of vias (or posts) which extend away from the guard ring and the light path. A first end of each via is connected to the guard ring, while second ends of the vias, opposite the first ends, are coupled by a conductive material, such as a metallic trace. The conductive material connecting to either side of the aperture is thus located away from the light path.

The configuration comprising an aperture ensures that there is no interaction of light with the doped ring of guard ring 360 and light is able to pass through the ring to PD 300 without being absorbed in the doped Si. As depicted in FIG. 4C, in this example, the guard ring 360 includes aperture 362 that is aligned to coincide with the path of light through waveguide 312. However, since guard ring 360 is not in the same plane as waveguide 312, while it may be beneficial, it is not necessary for guard ring 360 to include an aperture.

FIG. 4D is a top view of vertical PIN PD 300, with guard ring 360, and configured for bidirectional light input by inclusion of two apertures 362a and 362b. In this embodiment, apertures 362a and 362b each comprise metal connection 364 (using contact and via). This configuration ensures that there is no interaction of light with the doped ring of guard ring 360, and light is able to pass bidirectionally to PD 300 without being absorbed in the doped Si of guard ring 360. As depicted in FIG. 4D, in this example, the guard ring 360 includes two apertures disposed along the path of light through the waveguide. However, since guard ring 360 is not in the same plane as the waveguide, while it may be beneficial, it is not necessary for guard ring 360 to include apertures.

The layers of vertical PIN PD 300 are similar to those depicted in FIG. 3, such that vertical PIN PD 300 comprises silicon layer 310, doped p+ Si region 330, heavily doped p++ Si regions 350, intrinsic Ge layer 340, doped n+ Ge layer 335, metal vias 370 for contact and metal regions 380 for routing.

Figure 5:
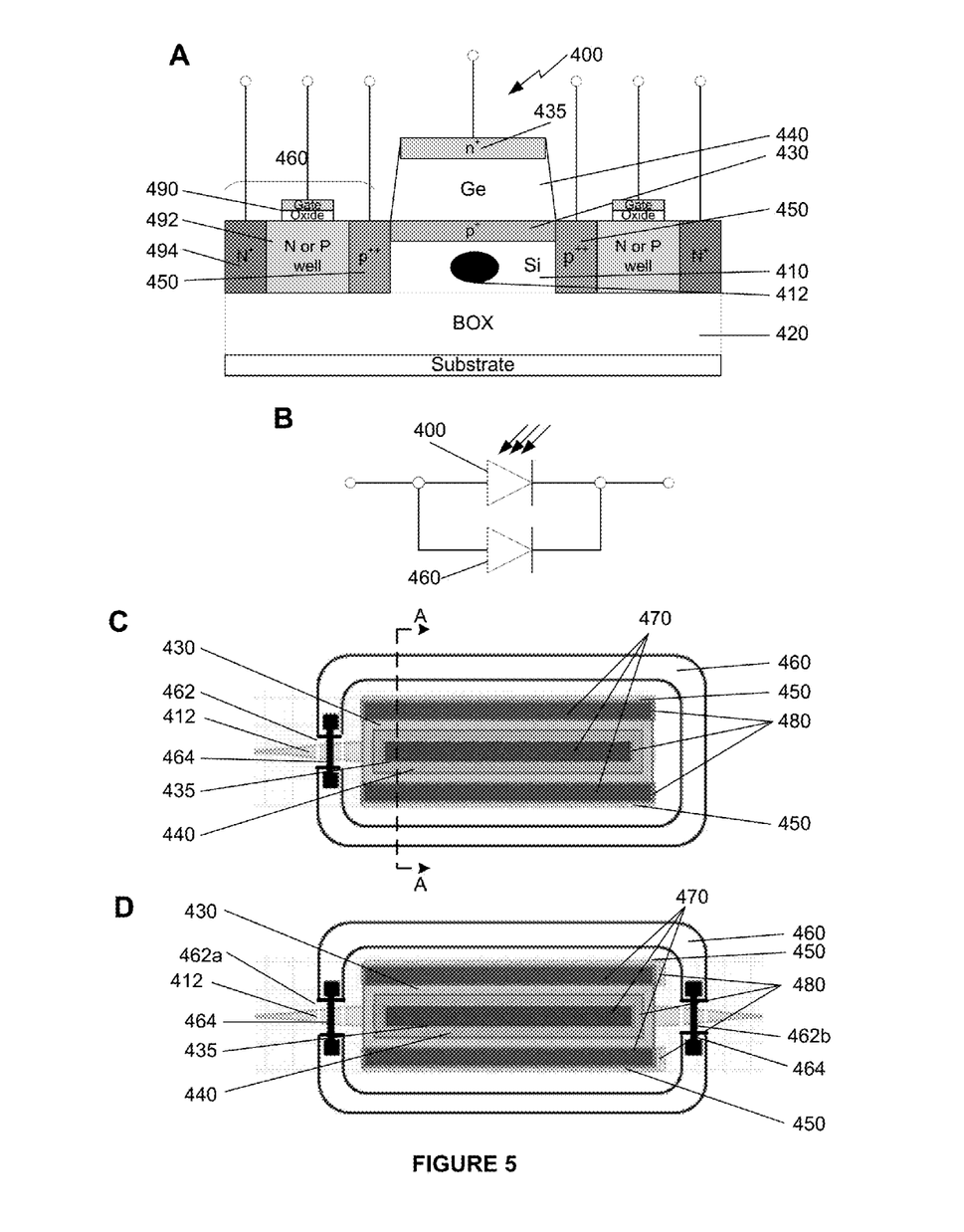
FIG. 5 depicts one embodiment of a vertical PIN photodiode that includes an ESD guard structure that is an SOI gated diode, where
Figure 6:
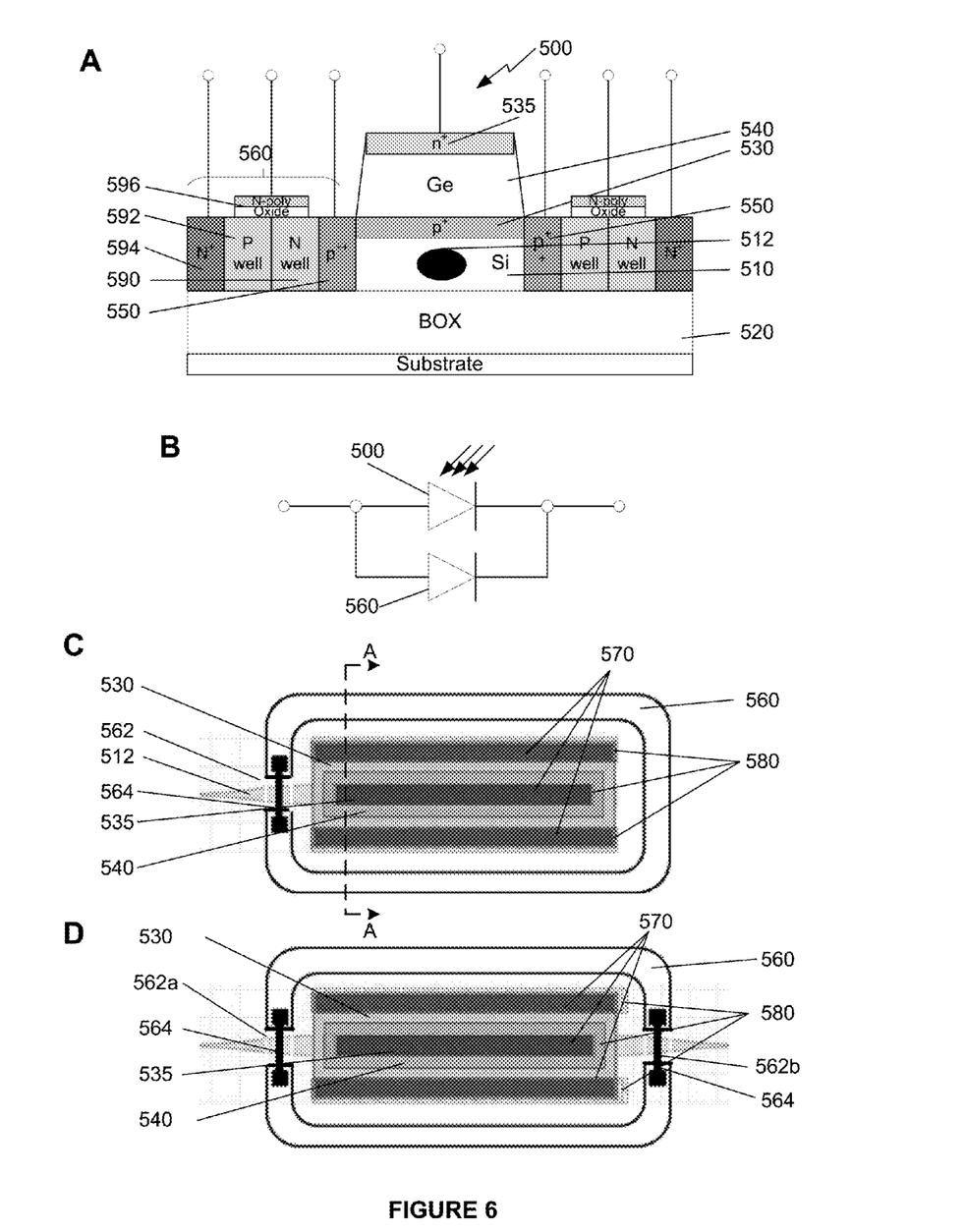
FIG. 6 depicts one embodiment of a vertical PIN photodiode that includes an ESD guard structure that is a double-well field effect diode, where
Figure 7:
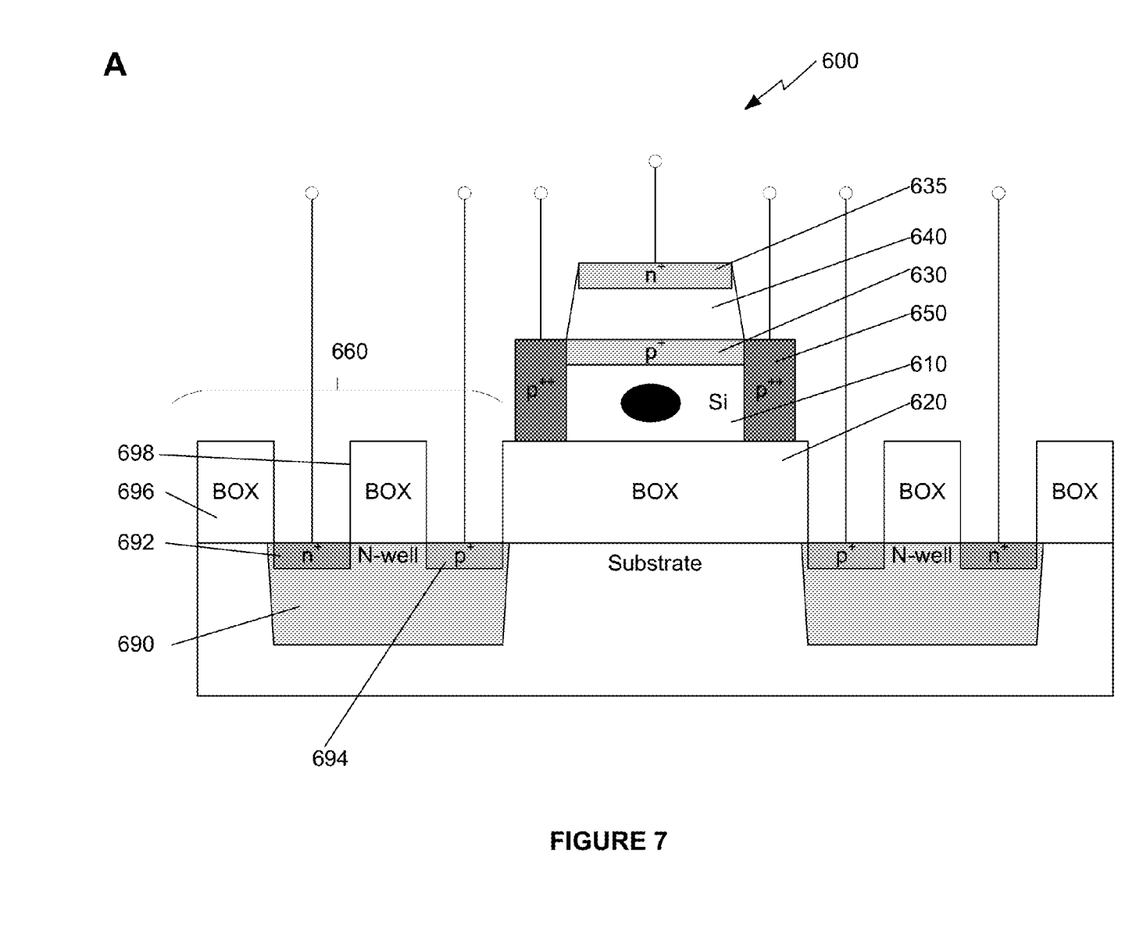
FIG. 7 depicts one embodiment of a vertical PIN photodiode that includes an ESD guard structure that is an "under-the-BOX" substrate diode, where

FIGS. 5-7 each depict alternative embodiments of the presently described GS. The overall structures comprising a PD and a GS, as shown in FIGS. 5-7, incorporate connections between the various section, using bridges and/or external circuits.

FIG. 5 depicts another embodiment of the GS. In this example, the GS is an SOI gated diode.

FIG. 5A is a cross-sectional view that depicts vertical PIN PD 400 integrated in a SiPh cell, comprising silicon layer 410, which comprises silicon waveguide 412, fabricated on BOX layer 420. Vertical PIN PD 400 comprises p+ region 430, n+ region 435 and intrinsic Ge region 440 located between the p+ and n+ regions. Heavily doped silicon p++ regions 450 surrounding vertical PIN PD 400 function to conduct electrical charge within the SiPh cell and form part of the GS. Vertical PIN PD 400 is protected by a GS that is guard ring 460. Guard ring 460 is an SOI gated diode, disposed in silicon layer 410 and comprising gate 470, an N or P well 472, n+ region 474 and heavily doped p++ region 450. In this structure, there is no well contact. Gate 470 is located above N or P well 472 and serves as a blocking structure to separate n+ region 474 and heavily doped p++ region 450 and to prevent electrical shorting caused by silicidation above the p-n junction region.

FIG. 5 schematically illustrates a circuit including vertical PIN PD 400 and the guard ring 460 (as a protection diode) connected in parallel cathode to cathode. The triple arrows symbolize impinging photons propagated from the silicon waveguide.

FIG. 5C is a top view of vertical PIN PD 400, with guard ring 460, and configured for unidirectional light input by inclusion of a single aperture 462, which is aligned with the light path through the silicon waveguide. In this embodiment, aperture 462 comprises metallic bridge 464 that electrically connects to the guard ring on either side of aperture 462, however, this bridge is optional. As described above, the metallic bridge comprises a pair of vias (or posts) which extend away from the guard ring and the light path. A first end of each via is connected to the guard ring, while second ends of the vias, opposite the first ends, are coupled by a conductive material, such as a metallic trace. The conductive material connecting to either side of the aperture is thus located away from the light path.

The presence of aperture 462 configuration reduces a possibility of interaction of light with the doped ring of guard ring. As such, light is able to pass through guard ring 460 to PD 400 with less chance of absorption in the doped regions of Si forming the guard ring. In this example, the aperture optionally includes a material that is optically transparent, or substantially optically transparent, to the light detectable by the PD 400.

FIG. 5D is a top view of vertical PIN PD 400, with guard ring 460, and configured for bidirectional light input by inclusion of two apertures 462a and 462b. In this embodiment, each aperture 462a and 462b may be spanned by a metallic bridge 464. This configuration reduces or eliminates interaction of light with the doped ring of guard ring 460 and light is able to pass bidirectionally through the ring to PD 400 without being absorbed in the doped Ge. Again, in this example, one or both apertures optionally include a material that is optically transparent, or substantially optically transparent, to the light having the wavelength(s) of light detectable by the PD.

The layers of vertical PIN PD 400 are similar to those depicted in FIG. 3, such that vertical PIN PD 400 comprises silicon layer 410, doped p+ Si region 430, heavily doped p++ Si regions 450, intrinsic Ge layer 440, doped n+ Ge layer 435, metal vias 470 for contact and metal regions 480 for routing.

FIG. 6 illustrates another embodiment of the presently described GS. In this example, the GS is double-well field effect diode guard ring. FIG. 6A is a cross-sectional view that depicts vertical PIN PD 500 integrated in a SiPh cell comprising silicon layer 510, comprising silicon waveguide 512, fabricated on BOX layer 520. Vertical PIN PD 500 comprises p+ region 530, n+ region 535 and intrinsic Ge region 540 located between the p+ and n+ regions. Heavily doped silicon p++ regions 550 surrounding vertical PIN PD 500 function to conduct electrical charge within the SiPh cell and forms part of guard ring 560. Vertical PIN PD 500 is protected by a GS that is guard ring 560, fabricated in silicon layer 510. As shown in FIG. 6A, guard ring 560 is a double-well field effect diode guard ring in the Si. Guard ring 560 comprises n-well region 590, p-well region, 592, n+ region 594, p++ region 550 and N-polyoxide gate 596.

Guard ring 560 comprises two wells (590 and 592) having the same length and disposed in the middle region of the diode structure. N-polyoxide gate 596 is placed above the two wells (590 and 592), allowing the formation of inversion in the wells as needed, by applying the appropriate gate bias. The electrical contact between the gate located above the well region (gate-bias contact) and the n or p-well of the diode is through the polysilicon gate. This means there is no direct connection of the wells.

FIG. 6B schematically illustrates a circuit including vertical PIN PD 500 and guard ring 560 (as a protection diode) connected in parallel cathode to cathode. The triple arrows symbolize impinging photons propagated from the silicon waveguide.

FIG. 6C is a top view of vertical PIN PD 500, with guard ring 560, and configured for unidirectional light input by inclusion of a single aperture 562, which is aligned with the light path to the PD. In this embodiment, aperture 562 comprises a metallic bridge 564 that electrically connects to the guard ring on either side of aperture 562, however, this bridge is optional. The metallic bridge comprises a pair of vias (or posts) which extend away from the guard ring and the light path. A first end of each via is connected to the guard ring, while second ends of the vias, opposite the first ends, are coupled by a conductive material, such as a metallic trace. The conductive material connecting to either side of the aperture is thus located away from the light path.

The presence of the aperture 562 configuration mitigates interaction of light with the doped ring of guard ring 560. As such, light is able to pass through the guard ring 560 to PD 500 substantially without absorption in the doped regions of Si forming the guard ring. In this example, the aperture optionally includes a material that is optically transparent, or substantially optically transparent, to the light having the wavelength(s) of operation of the PD.

FIG. 6D is a top view of vertical PIN PD 500, with guard ring 560, and configured for bidirectional light input by inclusion of two apertures 562a and 562b. In this embodiment, each aperture 562a and 562b may be spanned by metallic bridge 564. This configuration enables light absorption by the doped ring of guard ring 560 to be reduced or eliminated, such that light is able to pass bidirectionally through the ring to PD 500 without being absorbed in the doped regions of Si forming the guard ring.

The layers of vertical PIN PD 500 are similar to those depicted in FIG. 3, such that vertical PIN PD 500 comprises silicon layer 510, doped p+ Si region 530, heavily doped p++ Si regions 550, intrinsic Ge layer 540, doped n+ Ge layer 535, metal vias 570 for contact and metal regions 580 for routing. Again, in this example, one or both apertures optionally include a material that is optically transparent, or substantially optically transparent, to the light having the wavelength(s) of light detectable by the PD.

FIG. 7 illustrates another embodiment of the GS. In this example, the GS is an "under-the-BOX" substrate diode guard ring. That is, the semiconducting portions of the GS are disposed in a first planar region, the photodiode is disposed in a second planar region, and the waveguide is disposed in a third planar region located between the first and second planar regions. FIG. 7A is a cross-sectional view that depicts vertical PIN PD 600 integrated in a SiPh cell comprising silicon layer 610, comprising silicon waveguide 612, fabricated on BOX layer 620. Vertical PIN PD 600 comprises p+ region 630, n+ region 635 and intrinsic Ge region 640 located between the p+ and n+ regions. Heavily doped silicon p++ regions 650 surrounding vertical PIN PD 600 function to conduct electrical charge within the SiPh cell. Vertical PIN PD 600 is protected by a GS that is guard ring 660. As shown in FIG. 7A, guard ring 660 is an "under-the-BOX" substrate diode. Guard ring 660 comprises n-well region 690, n+ region 692, p+ region 694 and two BOX regions 696 and 698. This structure can help to alleviate heat-accumulation problems, if necessary.

FIG. 7B schematically illustrates a circuit including vertical PIN PD 600 and guard ring 660 (as a protection diode) connected in parallel cathode to cathode. The triple arrows symbolize impinging photons propagated from the silicon waveguide.

FIG. 7C is a top view of vertical PIN PD 600, with guard ring 660, and configured for unidirectional light input by inclusion of a single aperture 662 formed in the guard ring at a location below and aligned with the waveguide. In this embodiment, aperture 662 comprises metallic bridge 664 that electrically connects to the guard ring on either side of aperture 662. The metallic bridge is optional. The metallic bridge comprises a pair of vias (or posts) which extend away from the guard ring and the light path. A first end of each via is connected to the guard ring, while second ends of the vias, opposite the first ends, are coupled by a conductive material, such as a metallic trace. The conductive material connecting to either side of the aperture is thus located away from the light path.

The presence of the aperture 662 configuration reduces interaction of light with the doped ring of guard ring 660. As such, light is able to pass through guard ring 860 to PD 800 with less absorption in the doped Si regions forming the guard ring. In this example, the aperture optionally includes a material that is optically transparent, or substantially optically transparent, to the light having the wavelength(s) detectable by the PD. Furthermore, it should be noted that, since guard ring 660 is not in the same plane as waveguide 612, while it may be beneficial, it is not necessary for guard ring 660 to include an aperture.

FIG. 7D is a top view of vertical PIN PD 600, with guard ring 660, and configured for bidirectional light input by inclusion of two apertures 662a and 662b. In this embodiment, each aperture 662a and 662b is optionally spanned by a metallic bridge 664. This configuration mitigates interaction of light with the doped ring of guard ring 660 and light is able to pass bidirectionally through the ring to PD 600 without being absorbed in the doped Ge. Again, in this example, one or both apertures optionally include a material that is optically transparent, or substantially optically transparent, to the light having the wavelength(s) detectable by the PD. Furthermore, it should be noted that, since guard ring 660 is not in the same plane as waveguide 612, while it may be beneficial, it is not necessary for guard ring 660 to include any apertures.

The layers of vertical PIN PD 600 are similar to those depicted in FIG. 3, such that vertical PIN PD 600 comprises silicon waveguide layer 610, doped p+ Si region 630, heavily doped p++ Si regions 650, intrinsic Ge layer 640, doped n+ Ge layer 635, metal vias 670 for contact and metal regions 680 for routing.

All publications, patents and patent applications mentioned in this Specification are indicative of the level of skill of those skilled in the art to which this invention pertains and are herein incorporated by reference to the same extent as if each individual publication, patent, or patent applications was specifically and individually indicated to be incorporated by reference.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:
1. A photodiode assembly comprising:
a photodiode;
a waveguide in communication with the photodiode; and
an electrostatic discharge guard structure extending about substantially all of a periphery of the photodiode and comprising a diode, wherein the guard structure is co-planar with the waveguide or in a plane parallel to the plane of the waveguide,
wherein, when the guard structure is co-planar with the waveguide, the guard structure comprises at least one of:
an aperture; and
a substantially optically transparent structure at a wavelength of light detectable by the photodiode, and
wherein, when the guard structure is not co-planar with the waveguide, at least one of the following applies:

the guard structure is sufficiently spaced apart from the waveguide so that it substantially does not absorb light at the wavelength of light detectable by the photodiode;

the guard structure comprises an aperture; and the guard structure comprises a structure that is substantially optically transparent at the wavelength of light detectable by the photodiode.

2. The photodiode assembly of claim 1, wherein the photodiode is configured as a vertical PIN diode.

3. The photodiode assembly of claim 1, wherein the photodiode is configured as a PN lateral junction diode.

4. The photodiode assembly of claim 1, wherein the photodiode is constructed from Si, SiGe, a type III-V material, or a combination thereof.

5. The photodiode assembly of claim 1, wherein the guard structure comprises a PIN or PN lateral junction diode, P+/Nwell or N+/P-well vertical junction, a Zener diode or a combination thereof.

6. The photodiode assembly of claim 1, wherein the guard structure comprises a continuous guard ring.

7. The photodiode assembly of claim 2, wherein the guard structure comprises a continuous guard ring.

8. The photodiode assembly of claim 3, wherein the guard structure comprises a continuous guard ring.

9. The photodiode assembly of claim 1, wherein the guard structure is non-continuous.

10. The photodiode assembly of claim 2, wherein the guard structure is non-continuous.

11. The photodiode assembly of claim 3, wherein the guard structure is non-continuous.

12. The photodiode assembly of claim 9, wherein the guard structure comprises a guard ring having one aperture, wherein the aperture is disposed in the guard structure to correspond with entry of the waveguide into the photodiode.

13. The photodiode assembly of claim 10, wherein the guard structure comprises a guard ring having one aperture, wherein the aperture is disposed in the guard structure to correspond with entry of the waveguide into the photodiode.

14. The photodiode assembly of claim 11, wherein the guard structure comprises a guard ring having one aperture, wherein the aperture is disposed in the guard structure to correspond with entry of the waveguide into the photodiode.

15. The photodiode assembly of claim 9, wherein the guard structure comprises a guard ring having two apertures, wherein of the two apertures is disposed in the guard structure to correspond with entry of the waveguide into the photodiode.

16. The photodiode assembly of claim 10, wherein the guard structure comprises a guard ring having two apertures, wherein at least one of the two apertures is disposed in the guard structure to correspond with entry of the waveguide into the photodiode.

17. The photodiode assembly of claim 11, wherein the guard structure comprises a guard ring having two apertures, wherein at least one of the two apertures is disposed in the guard structure to correspond with entry of the waveguide into the photodiode.

18. The photodiode assembly of claim 1, wherein the guard structure is constructed from Si, Ge, SiGe, a type III-V material, or any combination thereof.

19. The photodiode assembly of claim 1, wherein the waveguide comprises a silicon waveguide.

* * * * *

UNITED STATES PATENT AND TRADEMARK OFFICE
CERTIFICATE OF CORRECTION

PATENT NO. : 9,806,112 B1
APPLICATION NO. : 15/269331
DATED : October 31, 2017
INVENTOR(S) : Dritan Celo, Dominic John Goodwill and Eric Bernier It is certified that error appears in the above-identified patent and that said Letters Patent is hereby corrected as shown below:

In the Specification

Column 3, Line 10, "Fig. 6E" should read --Fig. 2E--

Signed and Sealed this
Twentieth Day of February, 2018

Andrei Iancu
*Director of the United States Patent and Trademark Office*